US 9,558,804 B2

United States Patent
Müller

(10) Patent No.: US 9,558,804 B2
(45) Date of Patent: Jan. 31, 2017

(54) CHARGE STORAGE FERROELECTRIC MEMORY HYBRID AND ERASE SCHEME

(71) Applicant: NaMLab gGmbH, Dresden (DE)

(72) Inventor: Stefan Ferdinand Müller, Dresden (DE)

(73) Assignee: NAMLAB GGMBH, Dresden (DE)

(*) Notice: Subject to any disclaimer, the term of this patent is extended or adjusted under 35 U.S.C. 154(b) by 140 days.

(21) Appl. No.: 14/338,996

(22) Filed: Jul. 23, 2014

(65) Prior Publication Data

US 2016/0027490 A1 Jan. 28, 2016

(51) Int. Cl.
  *G11C 11/22* (2006.01)
  *H01L 29/78* (2006.01)
  *H01L 27/115* (2006.01)

(52) U.S. Cl.
  CPC .......... *G11C 11/2275* (2013.01); *G11C 11/223* (2013.01); *H01L 27/115* (2013.01); *H01L 29/78391* (2014.09)

(58) Field of Classification Search
  CPC . G11C 16/0483; G11C 16/26; G11C 16/3418; G11C 16/08; G11C 16/3459; G11C 11/24; G11C 11/412; G11C 13/0007; G11C 14/0009; G11C 14/0054; G11C 11/407; G11C 16/0433; G11C 16/34; G11C 19/28; G11C 8/08
  USPC .......... 365/145, 149, 148, 185.17, 185.02,365/185.05, 185.11, 185.18, 185.23, 185.29, 51,365/185.08, 185.19, 185.2, 185.21, 185.22
  See application file for complete search history.

(56) References Cited

U.S. PATENT DOCUMENTS

| 6,122,191 | A  * | 9/2000 | Hirose | G11C 14/00 257/315 |
| 2005/0117419 | A1* | 6/2005 | Hoshino | G11C 16/26 365/202 |
| 2006/0281239 | A1* | 12/2006 | Mathew | H01L 21/82380 438/197 |

(Continued)

FOREIGN PATENT DOCUMENTS

WO    0169602 A2    9/2001

OTHER PUBLICATIONS

International Search Report in corresponding International Patent Application No. PC/IB2015/055594, mailed on Dec. 18, 2015.

(Continued)

*Primary Examiner* — Thong Q Le
(74) *Attorney, Agent, or Firm* — Edell, Shapiro & Finnan LLC

(57) ABSTRACT

A technique for erasing a ferroelectric field effect transistor (FeFET) memory circuit comprising a plurality memory cells comprising FeFETs is described. Each FeFET comprises a gate stack, a source, a drain, a channel and a bulk substrate region, where the gate stack comprises a gate and a ferroelectric layer disposed between the gate and the channel. A positive or a negative voltage is applied to the source and drain regions of at least one FeFET memory cell depending on the channel type. The gate and bulk substrate regions are held at a ground state during said applying of the positive voltage to the source and drain regions of the FeFET memory cell to cause erasure of the at least one FeFET memory cell. In addition, a FeFET is described with a charge storage layer disposed adjacently to the ferroelectric layer within the gate stack.

16 Claims, 13 Drawing Sheets

(56) References Cited

U.S. PATENT DOCUMENTS

| | | | |
|---|---|---|---|
| 2010/0046290 A1* | 2/2010 | Park | G11C 16/0483 365/185.2 |
| 2011/0090731 A1* | 4/2011 | Chi | B82Y 10/00 365/145 |
| 2011/0305062 A1* | 12/2011 | Byun | G11C 11/22 365/145 |
| 2012/0195125 A1* | 8/2012 | Choe | G11C 16/0483 365/185.15 |
| 2014/0355328 A1* | 12/2014 | Muller | G11C 11/2275 365/145 |

OTHER PUBLICATIONS

Ytterdal, T., et al., "MOSFET Device Physics and Operation", Device Modelling for Analog and RF CMOS Circuit Design, 2003, chapter 1, John Wiley & Sons, Ltd, Chichester, UK.
Liu, X., et al., "Ferroelectric Memory Based on Nanostructures", Nanoscale Research Letters 2012 7:285, 1-16.

* cited by examiner

CHARGE STORAGE FERROELECTRIC MEMORY HYBRID AND ERASE SCHEME

BACKGROUND

Ferroelectric field effect transistors (FeFETs) have been envisioned and are still being researched as ultra-low power non-volatile memory devices. The most prominent non-volatile transistor architecture to date is, however, still represented by FLASH devices which are subgroups of charge storage (CS) based transistors. In this regard, CS-based transistors and FLASH devices may be considered to be the same "type" of devices. When compared to these FLASH devices, FeFETs require only a fraction of the write voltages and can be switched in the nanosecond regime. The write operation can either mean to program a memory cell into the binary "0" or "off" state, or programming (erasing) the memory cell to a binary "1" or "on" state, respectively. The difference in write voltages between FeFETs and charge storage based transistors (FLASH devices) originates from the fundamentally different underlying physical mechanisms used for storing binary data.

In order to represent binary states, FLASH devices use the injection of charge carriers (e.g., electrons) into a charge storing layer (e.g., a floating gate or trap layer) which thereby shifts the threshold voltage of the storing transistor. Since the charge carrier injection mechanism (e.g., hot carrier injection (HCI) or Fowler-Nordheim Tunneling (FN)) is only efficient to a certain degree (i.e., only a small fraction of all available electrons reach the probability to tunnel into the charge storing layer), the write speed of these devices is limited to the microsecond and millisecond regime for HCI and FN, respectively. Furthermore, in order to provide proper data retention, the tunnel oxide cannot be scaled down arbitrarily (i.e., made thinner), which in turn results in the elevated operational voltages of these devices.

FeFETs, however, are solely written by the electric field which develops when a potential difference exists between the gate and the source/drain/bulk regions of a transistor. Accordingly, FeFETs do not rely on charge storage for the representation of binary states. Due to the electric field across the ferroelectric material present in FeFETs, atoms are shifted into one of two stable positions or polarization states (dipoles). If such a ferroelectric material is incorporated into the transistor gate stack, the permanent dipole accompanying the displacement of atoms alters the threshold voltage of a transistor. The magnitude of the electric field, as well as the duration during which the electric field is applied, are both lower for FeFETs than for CS based transistors. For example, the electric field (E-field) for FeFETs can vary from ~0.1 kilovolts/centimeter (kV/cm) to ~1 megavolt/cm (MV/cm), while the E-field for CS-based transistors is on the order of ~10 MV/cm. Similarly, the duration for write operations for a FeFET can vary from 100 picosecond (ps) to 100 nanoseconds (ns), while the write duration for CS-based transistors is on the order of 1 microsecond ($\mu s$) to 1 millisecond (ms).

Although the underlying physical mechanisms of CS-based and ferroelectric transistors are quite different, the memory architectures concerning one-transistor (1T) approaches are similar. Just as in CS-based transistors, NAND, NOR and AND architectures have been proposed for FeFETs. Accordingly, FeFETs are affected by "disturb" issues known to exist for FLASH memories. Cells not selected for programming are subjected to electric field effects simply by sharing the same signal line (e.g., wordlines and bitlines) thereby introducing uncertainty with respect to the binary state of a given memory cell. Secondly, by writing cells, the electric field of cells being addressed can "bleed" over to the adjacent cells.

For example, in charge storage based transistors, cells adjacent to the cells being programmed can suffer from unwanted charge storage. Similarly, in ferroelectric transistors, those cells neighboring the cells to be programmed can suffer from or be "disturbed" by a polarization change. For both CS-based and ferroelectric transistors, the disturb effect originates from the fact that non-selected cells are exposed to unwanted electrical fields occurring when a selected cell is programmed. With regard to both FeFETs and CS-based transistors, there are approaches to avoid the "disturbance" of binary states. In FLASH-based devices, inhibit schemes may be employed (e.g., global or local self-boost program inhibit schemes for NAND FLASH) to reduce any disturb issues. FeFET arrays may use the $V_{DD}/2$ or $V_{DD}/3$ scheme that provides known advantages, or adapt inhibit schemes known to be effective for CS-based transistors.

SUMMARY

Described herein are techniques for an operational scheme applied to short channel FeFET devices (e.g., devices with a 10-50 nanometer (nm) channel length) that enables random access of FeFETs in memory arrays. Furthermore, the short channel FeFET techniques are combined by way of device that is a hybrid of a FeFET and charge storage device (e.g., a CS-FeFET), which improves scalability and power consumption of traditional charge based transistors. The effectiveness of the operational scheme is improved by way of extension or halo implants, and to some extent to longer channel devices, according to the overall doping scheme of a given transistor.

The techniques described herein provide several advantages over prior art FeFET operational schemes by using a Uniform Electric Field Erase Scheme (UEFES) that can be applied to both n-channel (p-bulk/well) as well as p-channel (n-bulk/well) ferroelectric transistors. This includes the application of the UEFES to both purely ferroelectric transistors as well as to hybrid transistors by making use of the ferroelectric effect. Purely ferroelectric transistors as known in the literature may include non-limiting example devices such as Metal-Ferroelectric Semiconductor (MFS)-FeFETs, Metal Ferroelectric Insulator Semiconductor (MFIS)-FeFETs or Metal Ferroelectric Metal Insulator Semiconductors (MFMIS)-FeFETs. Furthermore, within the scope of the inventive concepts described herein, the terms "program" and "erase" refer to changing the polarization of the ferroelectric transistor such that respective low or high threshold voltage states are achieved. The UEFES is based on the electric field distribution across the gate stack. To extend the UEFES to longer channel devices, the bulk can be adjusted by means of implants (e.g., extension, halo, channel or well implants).

Classical nonvolatile ferroelectric memory devices employ a capacitor coupled with a transistor. For example, many ferroelectric memories have been designed as a one-transistor one-capacitor (1T1C) configuration or as a 2T2C configuration. In these devices, the capacitor comprises metal layers with a ferroelectric disposed there between, and in combination with metal-oxide-semiconductor (MOS) access transistor, form a memory cell (e.g., equivalent to one binary bit of data). The metal layers, by their very nature, inherently distribute charge throughout their surface, and therefore, generate a uniform electric field between the metallic layers to achieve a uniform change in FE polarity.

Thus, classical capacitor-based ferroelectric devices do not suffer from any electric field inhomogeneity across the ferroelectric.

In order to change the polarity of the ferroelectric in a FeFET (which incorporates the ferroelectric into the gate stack), a substantially uniform electrical field has to be applied between the channel and the gate of the transistor. With respect to short channel devices, the UEFES is able to change the polarization state of the ferroelectric if the channel length of a FeFET is sufficiently short. As an example, the UEFES for an n-channel FeFET applies positive voltages to source and drain regions while keeping gate and bulk at ground. For short channel devices, these applied voltages create a homogenous electric field sufficient to change the polarization state of the ferroelectric material. Moreover, this novel effect could not be anticipated for prior art FeFETs since existing research has been directed to long channel type devices.

Furthermore, in general the UEFES cannot be compared to similar schemes applied to charge storage based transistors. For example, classical non-volatile charge storage based transistors working with, e.g., positive source and drain voltages to extract charge carriers from the charge storing layer, will work independent of the channel length of the memory device. These classical concepts do not rely on a homogenous electric field distribution, but rely at least upon some inhomogeneity to initiate the extraction of the charge carriers. This is not the case with respect to the inventive concepts described herein, since a substantially uniform E-field distribution inside the gate stack is relied upon. The uniform E-field distribution can be achieved by short channel devices, or devices which show a proper aspect ratio of the gate stack, without modification of the doping schemes for the transistor used. As channel length increases, the doping schemes are adjusted by changes in the well doping concentrations or geometry, or by additional doping such as extensions, halos or channel implants.

The operational techniques described herein rely on a uniform electric field distribution inside the gate stack. The uniform electric field distribution inside the gate stack can be achieved for short channel devices or more specifically, for devices which show a proper aspect ratio of the gate stack, i.e., channel lengths of 10 nm to 50 nm and corresponding insulator thicknesses (e.g., ferroelectric+interface layer thickness) in the range of 5 nm to 50 nm. Moreover, the UEFES can be achieved for devices with extension, halo, channel or well implants configured to extend the channel, and where all variations do not include a ferroelectric capacitor in the manner of classical devices. By using the UEFES it is possible to operate FeFET cell arrays in true random access manner, i.e., each bit or cell can independently be written without the need for word or block erasure.

The CS-FeFET hybrid uses parasitic charge storage inherent in FeFET devices possessing a large spontaneous polarization. In this sense, the definition of a ferroelectric, as used herein, shall generally include materials that show some kind/form of spontaneous polarization. Hence, the inventive concepts described herein, specify, but are not limited to, two different CS-FeFET representations: 1) a CS-FeFET that uses a ferroelectric material/layer, and 2) a CS-FeFET that uses an anti-ferroelectric material/layer. Moreover, persons skilled in the art can apply any material system that shows spontaneous polarization in order to realize CS-FeFETs, as mentioned above.

As a non-limiting example material system, the ferroelectric may comprise Hafnium Oxide ($HfO_2$) or hafnia, which can exhibit different polarization behaviors and varying amounts of spontaneous polarization depending on the manufacturing process conditions. Based on the tailored material properties of the ferroelectric, it is either possible to realize high-endurance FeFET devices or charge storage based CS-FeFET devices. The CS-FeFET makes use of the field enhancing effect in the tunnel oxide caused by the spontaneous polarization of the ferroelectric. Therefore, operational voltages of a charge storage device incorporating a ferroelectric can be reduced to values which enable the ferroelectric to switch polarization. In addition to the resulting reduced power consumption, the tunnel oxide can be further scaled down due to intrinsic charge retention caused by charge compensation of the ferroelectric polarization. Both effects may simplify the further reduction in cell size and the overall system overhead of charge storage based devices.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
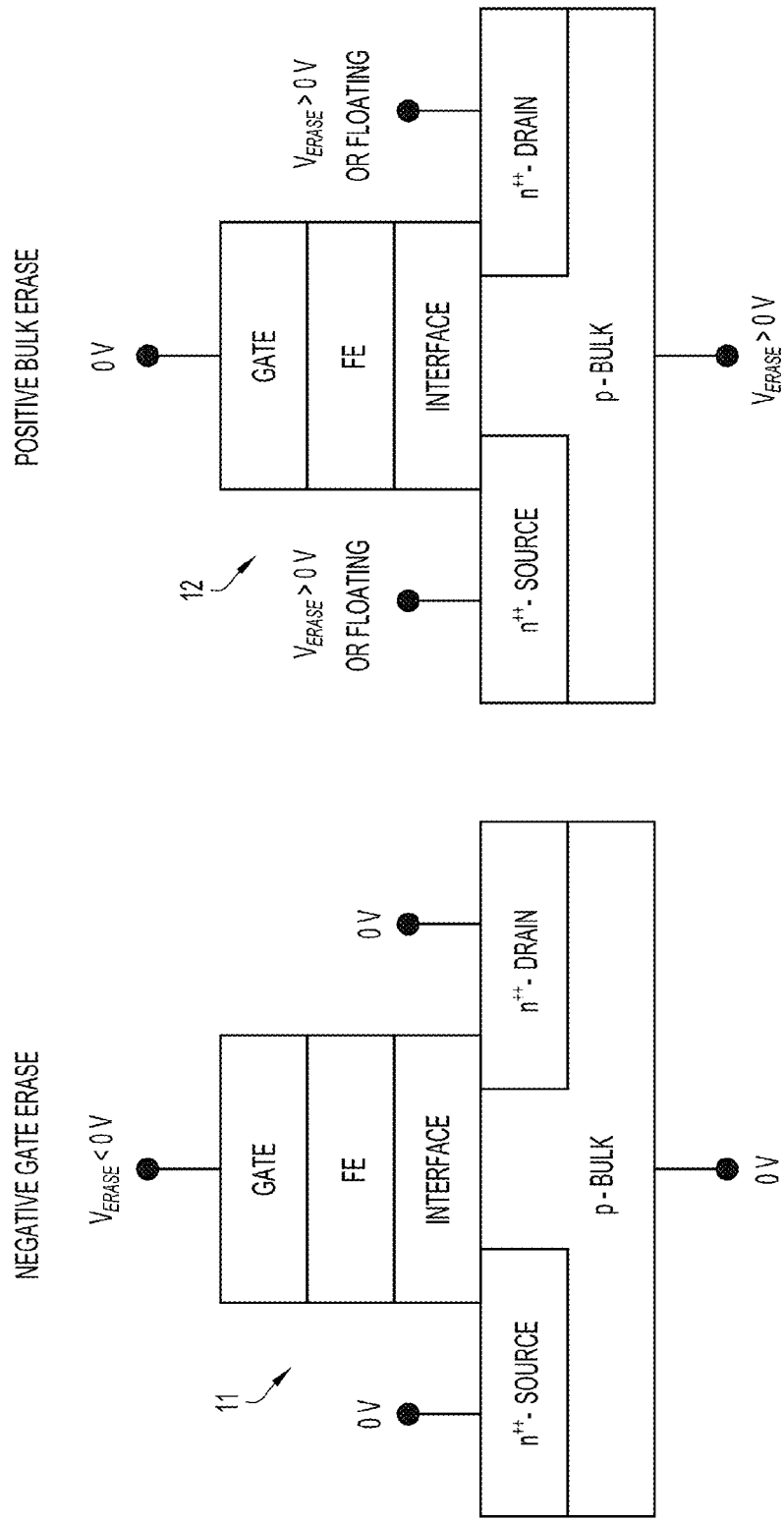
FIG. 1 illustrates examples of prior art memory erasing schemes exemplified but not limited to an MFIS-type FeFET.

Described herein is a new technique for erasing a ferroelectric field effect transistor (FeFET) memory circuit comprising a plurality of FeFET memory cells, each FeFET comprising a gate stack, a source, a drain, a channel and a bulk substrate region, where the gate stack comprises a gate and a ferroelectric layer disposed between the gate and the channel. According to the inventive concepts described herein, the erase operation shifts the threshold voltage of n-channel or p-channel FeFETs to more positive or to more negative values, respectively. In addition, a new type of FeFET is described with a charge storage layer disposed adjacently to the ferroelectric layer within the gate stack.

For an n-channel FeFET, a positive voltage is applied to the source and drain regions of at least one FeFET memory cell, while the gate and bulk substrate regions are held at a ground state during said applying of the positive voltage to the source and drain regions of the FeFET memory cell to cause erasure of the at least one FeFET memory cell.

Conversely, for a p-channel FeFET, a negative voltage is applied to the source and drain regions, while the gate and bulk substrate regions are held at a ground state during said applying of the negative voltage to the source and drain regions of the FeFET memory cell to cause erasure of the at least one FeFET memory cell.

In another example for either an n-channel FeFET or a p-channel FeFET, a first voltage may be applied to the source region and a second voltage may be applied to the drain region, where each of the first and second voltage are of the same polarity, (i.e., either the first and second voltages are both positive or the first and second voltages are both negative). The first and second voltages may be equal to each other or differ from each other in order to achieve the desired FeFET operation. In addition, or in lieu of holding the gate and bulk at ground, a third and a fourth voltage may be applied to the gate and bulk regions, respectively. The third voltage is of opposite polarity with respect to the first and second voltages. The fourth voltage is of the same polarity as the first and second voltages, yet lesser or smaller in magnitude than the first and second voltages. In other words, the fourth voltage as applied to the bulk is of the same polarity, yet of lesser magnitude that the voltages applied to the source or drain. This is true, regardless of whether a given FeFET is an n-channel (p-doped) or a p-channel (n-doped) FeFET.

As used herein and in the claims, the terms "n-channel" and "p-doped" may be used interchangeably with the recognition that when an n-channel device is operated at near punch through, the channel may be pinched or non-existent. Since the channel may no longer exist, the device is technically no longer an n-channel device and that a p-doped region remains. The same holds true for the terms "p-channel" and "n-doped" which may be used herein interchangeably.

In this regard, the first and second voltage may be positive for n-channel devices and negative for p-channel devices. Accordingly, the third voltage may be negative for n-channel devices and positive for p-channel devices and the fourth voltage may be positive for n-channel devices and negative for p-channel devices. In one embodiment, the first and second voltages applied to the source and drain regions, and the third and fourth voltage or ground applied to the gate and bulk regions may be varied so as to achieve near punch through operation of the FeFET. Those skilled in the art will appreciate that the first, second, third and fourth voltages may be applied to the corresponding bitlines, sourceline, wordlines and bulk regions as described in connection with the remaining figures.

Referring first to FIG. 1, examples of prior art memory n-channel FeFET erasing schemes are illustrated using a pair of FeFETs denoted by reference numerals 11 and 12, respectively. The left hand side of FIG. 1 illustrates a prior art negative gate erase scheme for FeFET 11, while the right hand side illustrates a prior art positive bulk erase scheme for FeFET 12. As used herein, the term "erase" refers to the action of setting the high-$V_T$ state in an n-channel FeFET and "bulk" refers to the material that may form a substrate or well for one or more terminals. A common way to erase a FeFET is to apply a negative voltage (e.g., $V_{Erase}$<0 volts) to the gate terminal while keeping all other terminals (e.g., source, drain and bulk) grounded (e.g., zero volts), as depicted for FeFET 11. This technique, however, requires negative voltage generation on a chip, e.g., in order to obtain $V_{Erase}$<0 volts, which is not common to standard logic designs. It should be understood that by way of a given array architecture, setting or writing a binary state, or erasure may require a high or low $V_T$ state.

In order to achieve the same negative potential difference from the gate to the bulk, it is possible to apply a positive voltage to the bulk (e.g., $V_{Erase}$>0 volts) while keeping the gate at ground (e.g., zero volts), as depicted for FeFET 12. This technique is derived from traditional erasing schemes in NOR-FLASH or NAND-FLASH memories. However it shall be highlighted that an erase operation for, e.g., n-channel NAND-FLASH shifts the threshold voltage to more negative values which is inverted to the FeFET erase. This originates from the fundamentally different underlying physics of the two concepts. Depending on the requirements of the memory product, the source and drain regions can either be kept floating or on the same erase voltage as the bulk. However, for classical FLASH architectures, these techniques are limited to erasing the entire bulk region without the granularity needed to erase a single FeFET/memory cell for truly random access.

Figure 2:
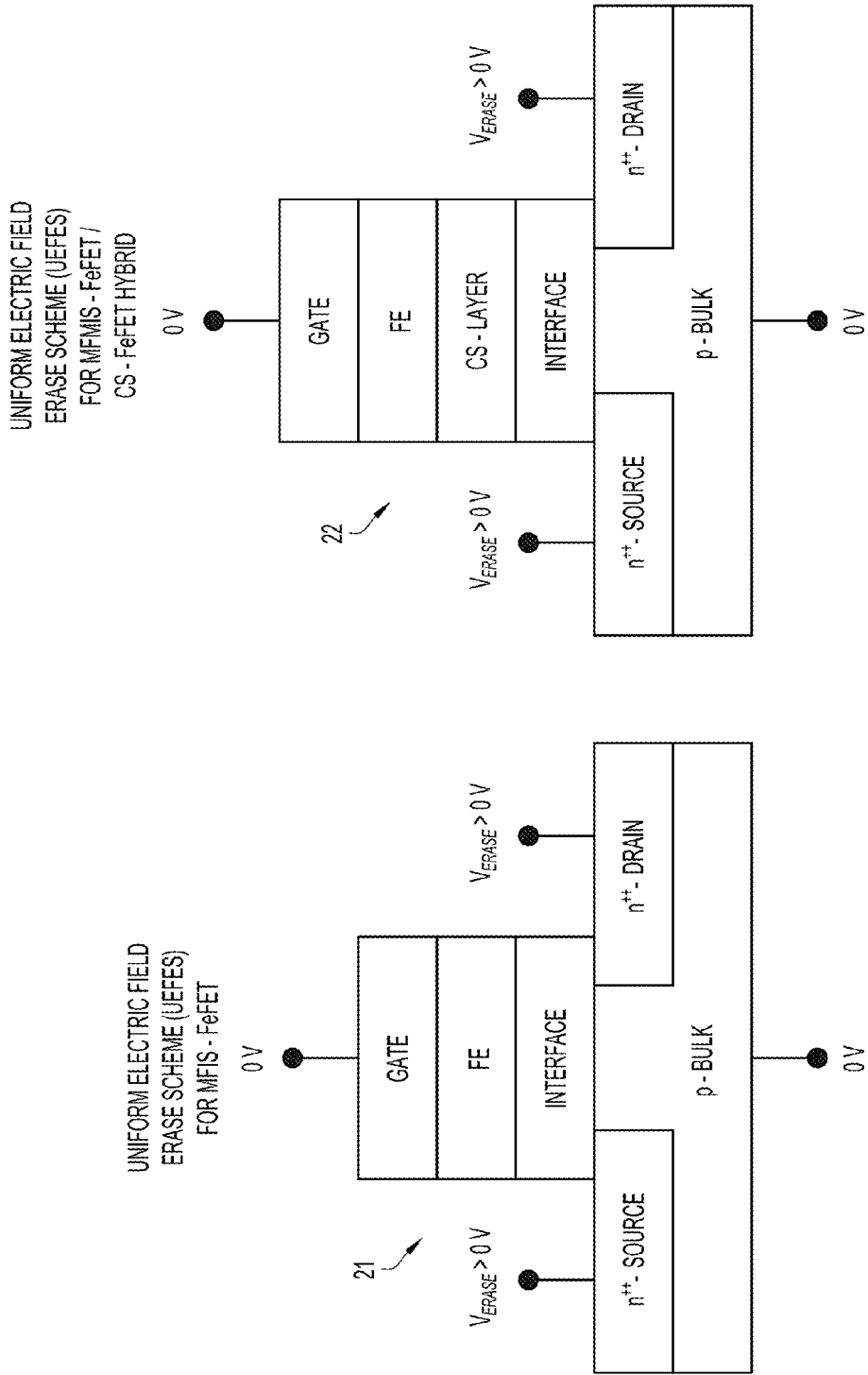
FIG. 2 illustrates a uniform electric field erase scheme (UEFES) for n-channel transistors in accordance with an example implementation of the inventive concepts described herein.

Turning to FIG. 2, a uniform electric field erase scheme (UEFES) for different FeFET architectures is illustrated according to the techniques described herein. For example, the UEFES scheme may be applied to MFIS-FeFET device 21, a Metal Ferroelectric Metal Insulator Semiconductor (MFMIS) or a newly designed Charge Storage FeFET (CS-FeFET) device 22. In contrast to the traditional erase operations for n-channel FeFETs (e.g., as depicted in FIG. 1), the positive erase voltage (e.g., $V_{Erase}$>0 volts) is applied to the source and drain region of the FeFET while keeping gate and bulk at ground as viewed in FIG. 2. The electric field distribution from the source/channel/drain to gate is homogenous over the ferroelectric (FE) film such that the whole ferroelectric film is converted into one of the two stable ferroelectric positions (e.g., one of two polarizations that indicate a binary state).

While the example shown in FIG. 2 involves applying the same voltage to the source and drain regions, as described above, more generally first and second voltages may be respectively applied to the source and drain regions of MFIS-FeFET 21 or CS-FeFET 22. The first and second voltage can be the same voltage or different voltages. For example, a first erase voltage ($V_{Erase1}$) may be applied to the source and a second erase voltage ($V_{Erase2}$) may be applied to the drain region. $V_{Erase1}$ and $V_{Erase2}$ may both be relative to or a variation of $V_{Erase}$ (e.g., $2V_{Erase}/3$). In some embodiments, it may be desirable to apply a third voltage to the gate, e.g., a negative voltage (or voltage of opposite polarity to the voltage applied to the source and drain), and apply a fourth voltage to the bulk, e.g. a positive voltage (or voltage of opposite polarity and smaller in absolute value with respect to the voltage applied to the source and drain) instead of keeping the gate and bulk at ground. This embodiment improves FeFET operation under certain conditions when negative voltages are available on the host chip.

As further described above, the first and second voltages applied to the source and drain regions of MFIS-FeFET 21 or CS-FeFET 22 may be negative. For example, $-V_{Erase}$ may be applied to the source and a negative voltage variation of $-V_{Erase}$ (e.g., $-2V_{Erase}/3$) may be applied the drain region or vice versa. In some embodiments, it may be desirable to apply a third voltage to the gate, e.g., a positive voltage (or voltage of opposite polarity to the voltage applied to the source and drain), and a fourth voltage to the bulk, e.g., a negative voltage (or voltage of same polarity and smaller in absolute value with respect to the voltage applied to the drain) instead of keeping the gate and bulk at ground.

In the example described, the transistor will be depleted in a way such that the device is operated close to or in the punch through regime of the field effect transistor. Near punch through operation (e.g., where the source and drain depletion regions merge) causes a defined depleted carrier concentration in the channel which makes a homogeneous electrical field between channel and gate metal possible. The homogeneous electric field will cause the ferroelectric between gate and channel to reverse its polarization state. The homogeneity of electric field distribution may be further improved by way of specific doping concentrations in the source/channel/drain area, thickness variations of the interface or effects obtained by the designed geometry of the FeFET stack (e.g., see FIG. 6). As an example, a stronger under diffusion of the source and drain regions leads to a more uniform electric field distribution during erase. Furthermore, an increase in ferroelectric film thickness while keeping the channel length constant results in a larger gate stack aspect ratio. The larger gate aspect ratio also leads to a more uniform electric field distribution.

Figure 5:
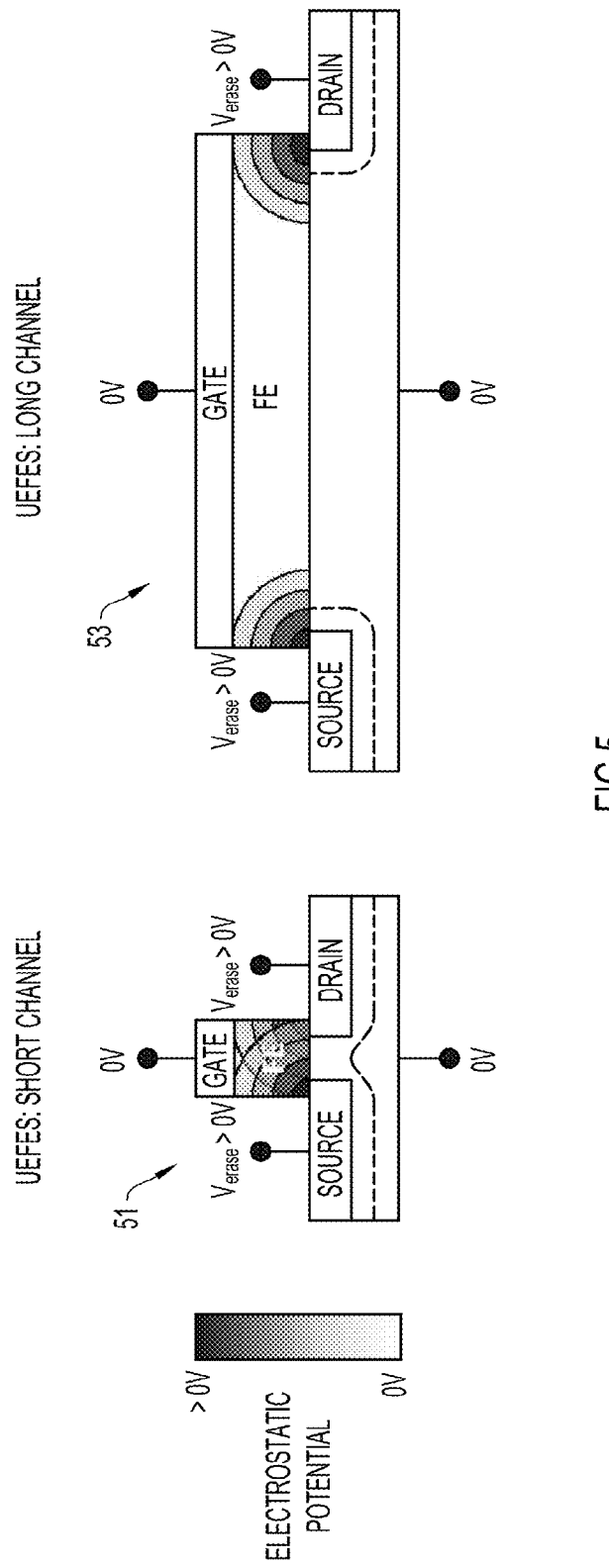
FIG. 5 illustrates the electrostatic potential for an n-channel MFS device when extending the UEFES from a short channel device to long channel device in accordance with an example implementation of the inventive concepts described herein.

If specific doping concentrations in the source/channel/drain area are not provided compared to the normal transistor specifications, the UEFES is limited to short channel devices due to their specific electric field penetrations (e.g., see FIG. 5). Taking for example the UEFES for n-channel FeFETs, positive voltages are applied to the source or drain regions. Even though it is known that n-channel charge storage based devices sometimes utilize positive source and drain voltages as well, they actually shift the threshold voltage to more negative values. This is due to the fundamentally different underlying physics of CS-based devices as compared to FeFETs. The binary state of these devices is encoded in the threshold voltage shift whose origin lies in the storage of electrons within a floating gate or charge trap layer. The erase operations utilizing a positive voltage applied to the source or drain regions in these prior art flash devices is therefore based on charge extraction from the charge storing layer and is not dependent on the channel length or homogeneous field distributions for the reasons described above.

For floating gate operation in these prior art flash devices, it becomes advantageous to have an inhomogeneous electric field distribution such that the electric field is high either between source and gate, or drain and gate, in order to foster the FN tunneling during charge extraction. In contrast, the techniques described herein, provide a near homogeneous electric field distribution obtained via either decreasing the channel length/improving the gate stack aspect ratio or by adjusting the specific doping concentrations, e.g., for longer channel devices. This is further described hereinafter in connection with FIG. 6 for MFIS and MFMIS devices, and for CS-FeFET devices in connection with FIG. 8A.

Furthermore, for MFMIS devices, the capacitive coupling from source and drain regions to the floating gate can enhance the erasure properties of these types of FeFET devices (compare, e.g., approaches taken for older 1.5 T FLASH cells). When transferring the UEFES to CS-FeFET devices (see FIG. 8A), the technique resembles the prior art operational principles of charge storage based devices. Hence, it then reflects a charge extraction from source and drain side rather than a polarization reversal due to a homogeneous electric field across the gate stack. However, the field enhancement is improved across the tunnel oxide due to the spontaneous polarization of the ferroelectric that is known to exist in FE materials.

Figure 3A:
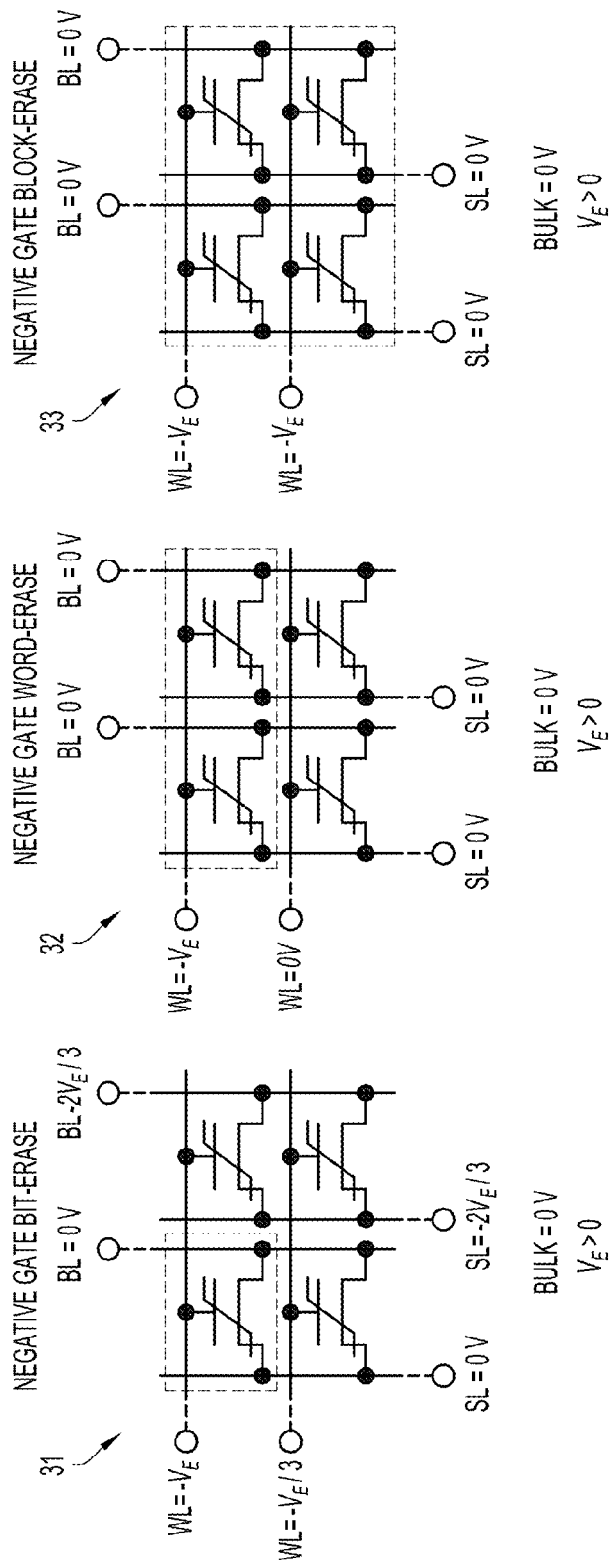
FIGS. 3A and 3B illustrate examples of prior art memory erasing schemes for an AND array architecture comprising FeFETs.
Figure 3B:
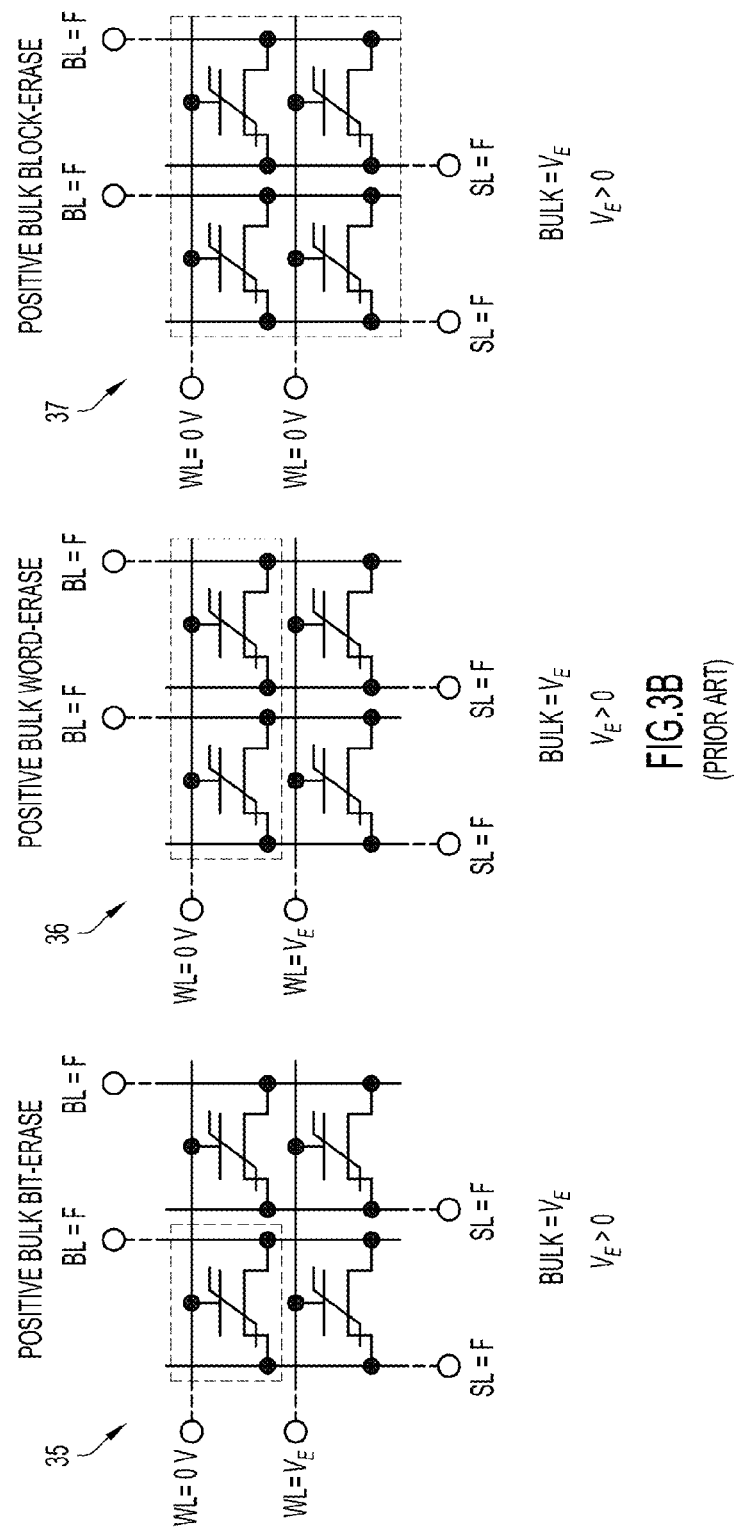

Referring to FIGS. 3A and 3B, a plurality of example prior art erase schemes is shown as applied to AND array n-channel FeFET storage architectures. The arrays depicted in FIGS. 3A and 3B comprise 2×2 arrays that represent four bits of memory, and that may be subsets of much larger storage arrays. The storage arrays shown in FIG. 3A include arrays 31, 32 and 33, and depict negative gate voltage erase schemes, while the storage arrays shown in FIG. 3B include arrays 35, 36 and 37 depict positive bulk voltage erase schemes. The storage arrays are set and erased using commonly known wordlines (WL), bitlines (BL) and sourcelines (SL). The wordlines are coupled to respective FeFET gates, the bitlines are coupled to respective FeFET drains and the sourcelines are coupled to respective FeFET sources, as shown in the various figures.

The negative gate erase scheme shown in FIG. 3A can be used for erasing a whole block of data by putting all block wordlines on a negative voltage while keeping the other terminals at ground, e.g., as shown for storage array 33. Bits selected for erasure are surrounded in dashed-line boxes in FIGS. 3A and 3B. A "block" as used herein and in the claims, is an M×N array of memory cells, e.g., where N represents a number of columns in the memory cell array and M represents a number of rows in the memory cell array. M and N may be equal to each other or any integer greater than or equal to one.

The erase voltage ($V_E$) for FeFETs with a 10 nm thickness of the ferroelectric and a 1 nm thickness of the interfacial layer may be set to approximately 5V (for a negative gate erase $-V_E$ results in $-5V$ at the gate). In general, the erase voltage $V_E$ and the program voltage $V_P$ depend on the voltage divided between ferroelectric layer/interfacial layer and semiconductor (series connection of capacitors) and are chosen such that the coercive field of the ferroelectric is overcome. According to experiments, the coercive field is considered to be in the range of 0.1 MV/cm up to 3 MV/cm depending on the ferroelectric material that is used. The most commonly observed value for the example ferroelectric, i.e., ferroelectric hafnia, is 1 MV/cm. People skilled in the art can adjust the operational voltages according to the gate stack geometry such that and electric field of 1 MV/cm will be achieved across the ferroelectric layer.

The negative gate erase scheme can also be applied to a word-wise erase, i.e., a complete wordline can selectively be erased if all other wordlines are kept on 0V, e.g., as shown for storage array 32. Essentially, a "word" as used herein and in the claims, is a 1×N array of N memory cells, i.e., a certain number of memory cells that share the same wordline.

Selecting only one bit to be erased requires the use of inhibit signals on unselected word, bitlines and sourcelines. In order to avoid unintentional disturbance of neighboring cells, a well-known $V_{DD}/3$ scheme can be applied. It results in the least parasitic voltage drop across cells adjacent to the cell being erased. In this example and for the $V_{DD}/3$ scheme, the unselected source- and bitlines are set to $-2V_E/3$ ($V_E>0V$), the unselected wordline is set to $-2V_E/3$ whereas the bulk is kept at ground as shown for storage array 31.

As can be seen to those skilled in the art from FIG. 3A, there is one major drawback to the $V_{DD}/3$ inhibit scheme: Applying the $V_{DD}/3$ scheme to an erase operation means that source and drain regions of n-type FeFETs have to be biased with a negative voltage ($-2V_E/3$) which unequivocally leads to a parasitic current flow from bulk to source and drain. Since this current flow happens for all cells being inhibited, the power consumption is increased and may be unacceptably large. As a result, only word or block erase schemes are viable for a negative gate erase scheme.

For the positive bulk erase scheme shown in FIG. 3B, the above description for a negative gate erase holds, except that an erase inhibit is not possible at all, since the cells sharing the same wordline with the cell being erased cannot be inhibited from erasing. Hence, these cells will change their state unintentionally which makes a single bit erase for the positive bulk erase scheme impossible (e.g., storage array 35 described below).

The positive bulk erase scheme shown in FIG. 3B can be used for erasing a whole block of data by putting the bulk on a positive voltage ($V_E>0V$) while keeping the wordlines at ground, e.g., as shown for storage array 37. The positive bulk erase scheme can also be applied to a word-wise erase, i.e., a complete wordline can selectively be erased when all other wordlines are kept on a positive voltage, e.g., as shown for storage array 36. However, when only one bit is to be erased, e.g., as shown for storage array 35, the erasure cannot be achieved without also erasing the bit adjacent to the desired bit on the same wordline (e.g., as shown for storage array 36. In other words, since the sourcelines and bitlines for storage arrays 35 and 36 are floating, it is not possible to select a single bit for erasure such that if one attempts to erase a bit in array 35, one also inherently erases the adjacent bit (thereby forming a word erasure) as shown in array 36.

Figure 4A:
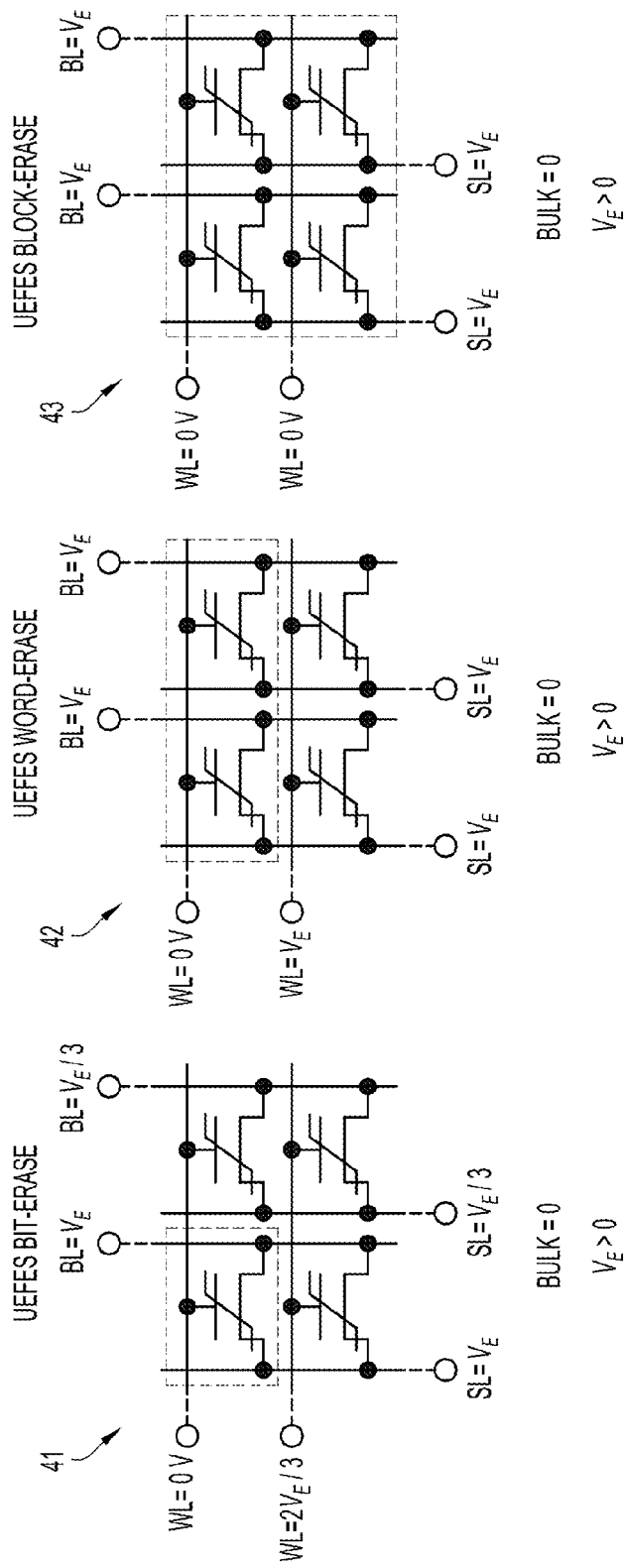
FIG. 4A illustrates the UEFES for an n-channel FeFET array in accordance with an example implementation of the inventive concepts described herein.

Turning now to FIG. 4A, the uniform electric field erase scheme (UEFES) is depicted in the context of array operations according to the techniques described herein. As in the previous examples, the AND array is chosen as an example for the UEFES. The principles of the UEFES can be applied to other architectures as well (e.g., a NOR based architecture).

The arrays depicted in FIG. 4A comprise 2×2 arrays of FeFETs that represent four bits of memory, and that may be subsets of much larger storage arrays. The storage arrays shown in FIG. 4A include arrays 41, 42 and 43, and depict operation of the UEFES. In this example, as in the other 2×2 array examples, a word and block erase may be performed using the UEFES. However, by way of the UEFES techniques provided herein, it is possible to erase one single bit (one single FeFET) without the drawbacks described above. That is, a $V_{DD}/3$ scheme can provide the necessary inhibiting voltages without leading to parasitic current from source/drain to bulk or changing the states of neighboring cells. Thus, the UEFES enables single bit erasure which, together with a standard $V_{DD}/3$ program scheme, enables true random access operation.

The UEFES shown in FIG. 4A can be used for erasing a whole block of data by putting all bitlines and sourcelines on various example positive voltages, while keeping the wordlines at ground, e.g., as shown for storage array 43. Referring to storage array 43, the erase voltage is positive (i.e., $V_E>0V$). To perform a block erase, the bitlines are set to the erase voltage (BL=$V_E$), the sourcelines are also set to the erase voltage (SL=$V_E$), while the wordlines and bulk are set to zero volts (WL=0V).

As described above, bits selected for erasure are surrounded in dashed-line boxes. The UEFES can be applied to a word-wise erase, i.e., only a complete wordline can selectively be erased if all other wordlines are kept on a desired positive voltage, e.g., as shown for storage array 42. Referring to storage array 42, the erase voltage is positive (i.e., $V_E>0V$). To perform a wordline erase (e.g., 1×N array of N memory cells), the bitlines are set to the erase voltage (BL=$V_E$), the sourcelines are also set to the erase voltage (SL=$V_E$), while the erase wordline and bulk are set to zero volts (WL=0V). To inhibit programming or bleed over to adjacent wordlines, the adjacent wordline is set to the erase voltage (WL=$V_E$) as viewed in the figure.

Moreover, by virtue of the techniques described herein, selecting one single bit to be erased can be achieved without parasitic current flow on neighboring bitlines and sourcelines, and without changing the states of neighboring cells. To eliminate disturb on neighboring cells when erasing a single memory cell in a wordline page, inhibit signals are applied to neighboring bitlines and sourcelines, e.g., using a $V_{DD}/3$ technique. In this example, the $V_{DD}/3$ scheme is set to $V_E/3$, where the erase voltage is a positive voltage ($V_E>0V$). Referring to storage array 41, to perform a bitwise erase of a single cell, the selected cell bitline is set to the erase voltage (BL=$V_E$) and the adjacent bitline is inhibited (BL=$V_E/3$), the selected cell sourceline is also set to the erase voltage (SL=$V_E$) and the adjacent sourceline is inhibited (SL=$V_E/3$), while the erase wordline and bulk are set to zero volts (WL=0V). To inhibit programming or bleed over to adjacent wordlines, the adjacent wordline is set to a $V_{DD}/3$ voltage (WL=$2V_E/3$) as viewed in the figure.

The single bit UEFES for storage array 41 is analogous to the erasure described in connection with FIG. 2. For example, the first and second voltage applied to the source and drain regions for the bit to be erased are set to a positive voltage (i.e., SL=BL=$V_E$), while a third and fourth voltage is applied to the gate and bulk regions (e.g., zero volts). It should be understood that in some embodiments, the third voltage may be set to a negative voltage and the fourth voltage set to a positive voltage and smaller in absolute value than $V_E$. While in the examples of FIG. 4A, both the bitlines and sourcelines of the cells to be erased are set to the same erase voltage ($V_E$), more generally, the first and second erase voltage, which can be the same or different voltages, can be applied respectively to the bitlines and sourcelines to effect erasure.

Figure 4B:
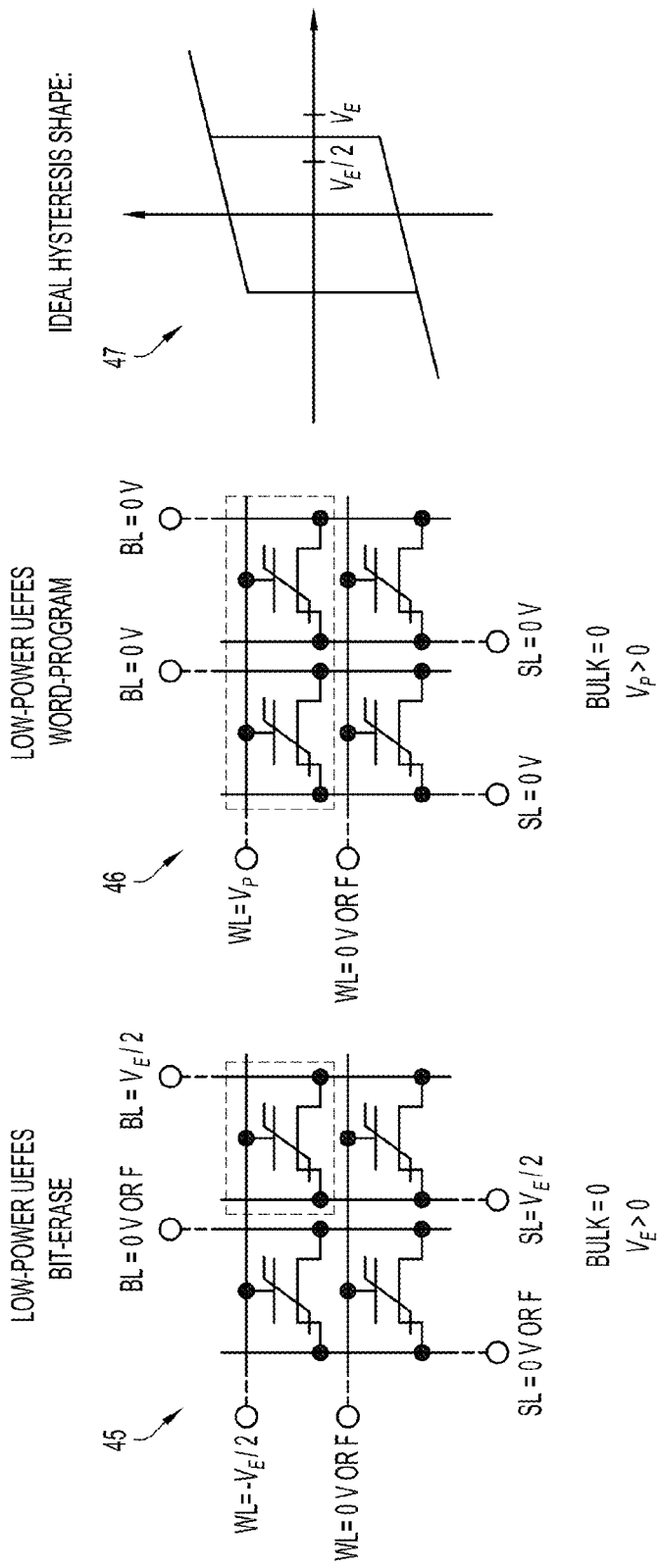
FIG. 4B illustrates the UEFES for low power erasure and programming of an n-channel FeFET for array in accordance with an example implementation of the inventive concepts described herein.

In FIG. 4B, another operational scheme based on the UEFES is described. For example, by changing from a $V_{DD}/3$ to a $V_{DD}/2$ scheme, it is possible to eliminate additional inhibit voltages and thereby decrease the overall power consumption of the array (e.g., as inhibit signals always require the charging up of neighboring signal lines which results in significant power consumption, especially when memory blocks are large and/or are permanently written to). FIG. 4B depicts a storage array 45 for low power UEFES bitwise erase, a storage array 46 for low power word-wise programming and a ferroelectric hysteresis loop graph 47. Graph 47, with polarization strength on the vertical axis and electric field strength on the horizontal axis, depicts the relative low power advantage of the $V_{DD}/2$ scheme relative to a positive $V_E$ that is recognizable by those skilled in the art.

A prerequisite for the Low-Power UEFES Bit-Erase is that the hysteresis shape of the ferroelectric material is close enough to rectangular such that the $V_E/2$ disturb which is experienced by non-selected cells does not alter the binary states, e.g., see graph 47. The highest level (finest) granularity for programming operations, yet also avoids inhibit signals, is attained by a word-wise programming. Therefore, a program voltage (i.e., $V_P>0V$ for n-channel FeFETs or $V_P<0V$ for p-channel) is applied to the selected wordline and the selected bitlines and sourcelines are kept at ground. Non-selected wordlines may be kept at ground (0V) or floating (F). Hence, cells belonging to the selected wordline are all programmed (e.g., for an n-channel FeFET, $V_P>0V$, and accordingly, all cells reside in a low-$V_T$ state afterwards). Furthermore, it is possible to make the programming operation bit-selective by applying $V_P/2$ to unselected bitlines and sourcelines. This operation would, however, increase power consumption.

Referring to storage array 45, to perform a low power UEFES bitwise erase of a single cell, the selected cell bitline is to one-half the erase voltage ($BL=V_E/2$) and the adjacent bitline is set to 0V or left to float ($BL=0V/F$), the selected cell sourceline is also set to one-half the erase voltage ($SL=V_E/2$) and the adjacent sourceline is set to 0V or left to float ($SL=0V/F$). The erase wordline is negatively biased with a $V_{DD}/2$ voltage ($WL=-V_E/2$), while the bulk is held at ground. The adjacent wordline is set to 0V or left to float ($WL=0V/F$) as viewed in the figure. Note that as described above, for n-channel FeFETs, $V_E>0V$ and for p-channel FeFETs, $V_E<0V$, and that unselected signal lines remain at 0 V or floating (F) which eliminates power consumption for charge up to inhibit voltages that would occur with other voltage schemes (e.g., $V_{DD}/3$).

Referring to storage array 46, to perform a low power word-wise programming of an array, the selected wordline is set to the programming voltage ($WL=V_P$, where $V_P>0$). All cell bitlines and sourcelines are set to 0V ($BL=SL=0V$). The adjacent wordline is set to 0V or left to float ($WL=0V/F$), and the bulk is set to $V_P$, as viewed in the figure. The wordline programming is described as being part of the UEFES (i.e., an erase scheme). It demonstrates how to complete an UEFES scheme with programming as will be appreciated by those skilled in the art.

FIG. 5 illustrates a short channel MFS device 51 (the interface is neglected for simplicity) as well as a long channel MFS device 53 when the UEFES is applied. As viewed in FIG. 5, the electrostatic equipotential lines within the ferroelectric material are color coded from darker (>0V) to lighter (0V) to illustrate the electrostatic potential gradient in the FE. Equipotential lines are depicted for ease of illustration and it should be understood that the electrostatic potential gradient is more or less a continuous (as opposed to discrete) function in the FE. By way of example, the short channel MFS 51 may have a channel length of, e.g., 10-50 nm, while the long channel device may have a channel length greater than 50 nm (e.g., in the range of 50-500 nm). As viewed in FIG. 5, for MFS 51 both the electrostatic equipotential lines originating from source and drain overlap as well as the depletion regions of source and drain merge. Both effects lead to a much more uniform field distribution within the ferroelectric film as compared to the long channel MFS 53. For the long channel device, the equipotential lines do not superimpose and the source drain depletion regions do not merge. Due to the dense electric field distribution in a short channel transistor, it is possible to reverse the polarization of the ferroelectric material by applying a positive source and drain potential while keeping gate and bulk on ground.

By way of example, for the UEFES to work without explicit optimizations of the gate stack, channel lengths of 10 nm to 50 nm should work for corresponding insulator thicknesses (e.g., ferroelectric+interface) in the range of 5 nm to 50 nm. Besides the interface, the gate stack insulator comprises a ferroelectric material that is at least partially in a ferroelectric state and further comprises, as main components, oxygen and any of the group consisting of Hf, Zr and (Hf, Zr). The dielectric constant is about 20 to 40 relative that of a vacuum (defined a one). Any suitable additives may be provided within the ferroelectric material oxide layer including, without limitation, any one or more of C, Si, Al, Ge, Sn, Sr, Pb, Mg, Ca, Sr, Ba, Ti, Zr (e.g., providing Zr as an additive in a $HfO_2$ layer), Ti, and any one or more of the rare earth elements (e.g., Y, Gd, La etc.). The doping may change the dielectric constant.

Laboratory experiments have confirmed this functionality for 30 nm channel lengths and 10 nm HK thicknesses of such a film with a +5V source/drain erase voltage for n-channel FeFETs. Expressing the FeFET geometry in terms of an aspect ratio (i.e., gate stack height to gate length) this ratio may range from 0.1 (worst case 5 nm/50 nm) to 5 (best case 50 nm/10 nm). Tradeoffs that may be considered are: 1) increasing the high-k film thickness leads to increased operational voltages (e.g., constant field scaling), whereby gate stack patterning problems may be more severe, and 2) decreasing the high-k thickness to approximately 5 nm which might lead to a loss of ferroelectric functionality.

The long channel MFS 53 has a channel length of 100-500 nanometers. As viewed in FIG. 5, MFS 53 shows no potential drop in the center of the ferroelectric material, hence and to a first approximation no electric field is present in the middle of the FeFET. Moreover, the source and drain space charge regions are well separated. Consequently, it is not possible to switch the ferroelectric material by means of e.g., positive source/drain voltages (n-channel FeFET). To lengthen the source/drain regions in these type of devices, a corresponding concentration of extension implants may be employed.

To ensure a uniform electric field between channel and gate, the bulk may be doped according to the techniques further described hereinafter in connection with FIG. 6. That is, by means of extension, halo, channel or substrate/well implants, the UEFES can be optimized for short channel devices and can be enabled for longer channel devices. As used and described herein, and in the claims, a "long channel" device has a channel length greater than 50 nm.

Figure 6:
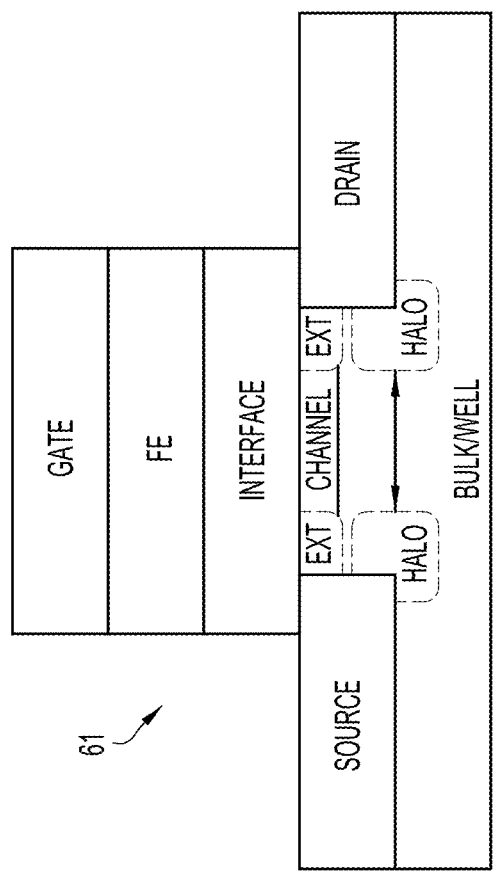
FIG. 6 illustrates implant variations for UEFES in accordance with an example implementation of the inventive concepts described herein.

Turning now to FIG. 6, the UEFES may be optimized by the implant variation as depict for a FeFET 61, e.g., an MFIS-FeFET. In this example, strong under-diffusion/extension (Ext) implants are disposed in the bulk near the bulk/source, bulk/drain and the bulk interface layer junction as viewed in the figure. To further optimize FeFET 61 halo implants are added. The implant specifications in terms of species (e.g., arsenic), energy (1-5 kV), dose (1E14-5E15/$cm^2$) and tilt)(0°-20° are chosen such that extensions will lead to a donor net concentration of approximately 1E19-

5E20 cm$^{-3}$. Halo implant species (e.g., BF2), energy (10-30 kV), dose (1E13-2E14/cm$^2$) and tilt (20°-60°) are chosen such that parasitic punch through can be avoided. This technique assumes that the memory transistor is of n-channel type. If a p-type FeFET is desired, then the specifications have to be adjusted accordingly. It should be understood that the design of the doping regions and concentrations are known to those skilled in the art.

Figures 7A, 7B:
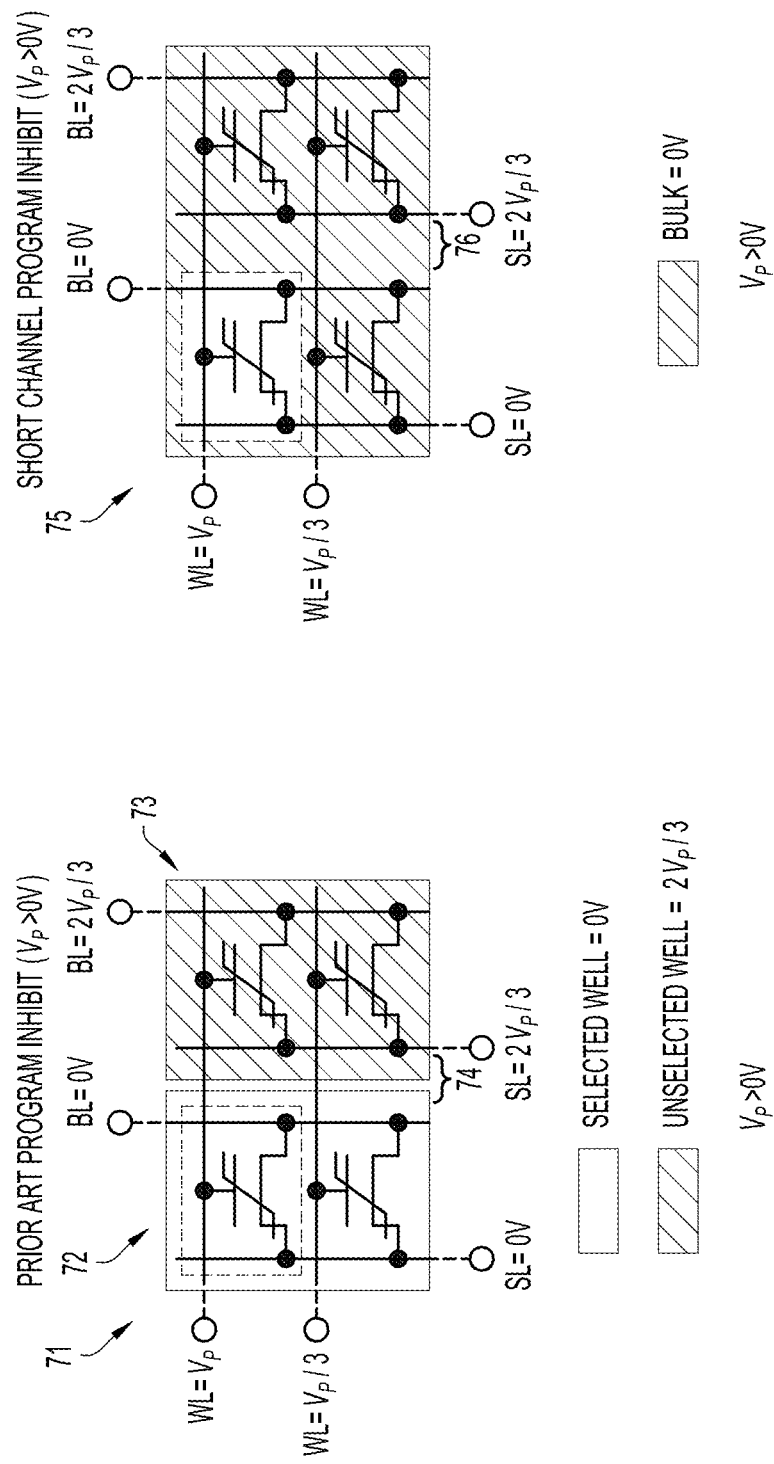
FIGS. 7A (prior art) and 7B illustrates a program inhibit scheme enabled due to the uniform field distribution in a short channel device or a device with the proper gate stack aspect ratio in accordance with an example implementation of the inventive concepts described herein.

FIG. 7A shows a prior art program inhibit scheme for a FeFET (n-channel) cell array 71. The array 71 has two regions/wells 72 and 73, each with two transistors (positioned vertically in the well), that uses a separate bulk voltage for each cell, e.g., $2V_P/3$, in order to inhibit neighboring cells from a parasitic program operation, where $V_P>0V$. This prior art inhibit scheme can be achieved only if the respective neighboring cell columns have individual wells with designed isolation spacing there between, e.g., as indicated at reference numeral 74. In this example, the transistor to be programmed is surrounded by a dashed box, while all other adjacent transistors are to be inhibited from programming. Accordingly, a selected well (with a bit to be programmed) has a well voltage set to 0V, while the inhibited cells in the neighboring unselected well (column) have their well set to $2V_P/3$.

Due to design constraints, separate wells can be achieved only for transistors with sufficient spacing in between them, e.g., as indicated at reference numeral 74. Hence, the density of prior art memory arrays with architectures that make use of many separate wells is limited by surface areas needed to ensure well separation. Thus, a "well" as used herein and in the claims, is portion of the bulk substrate comprising two or more memory cells with sufficient spacing to be isolated from other neighboring memory cells such that a voltage can be applied to the well substrate without substantially affecting the operation of the neighboring memory cells.

FIG. 7B depicts a program inhibit scheme according to the inventive concepts described herein as applied to memory array 75. Assuming that array 75 comprises short channel devices, as defined previously, it is possible to inhibit parasitic programming solely by applying an inhibit voltage, e.g., $2V_P/3$) to the respective bit and source lines of neighboring cells, while keeping the bulk at 0V, as shown in the figure. This technique eliminates the need for separate wells, which in turn, leads to higher density memory arrays, i.e., the gap indicated at reference numeral 76 can be reduced or eliminated. In other words, this technique is comparably the inverse inhibit scheme when compared to the UEFES. Whereas the UEFES enables random erase operation and thereby does not alter/erase neighboring cells parasitically, i.e., a program inhibit scheme that aims at programming one selected cell while not altering or programming the state of neighboring cells/wells.

Figure 8A:
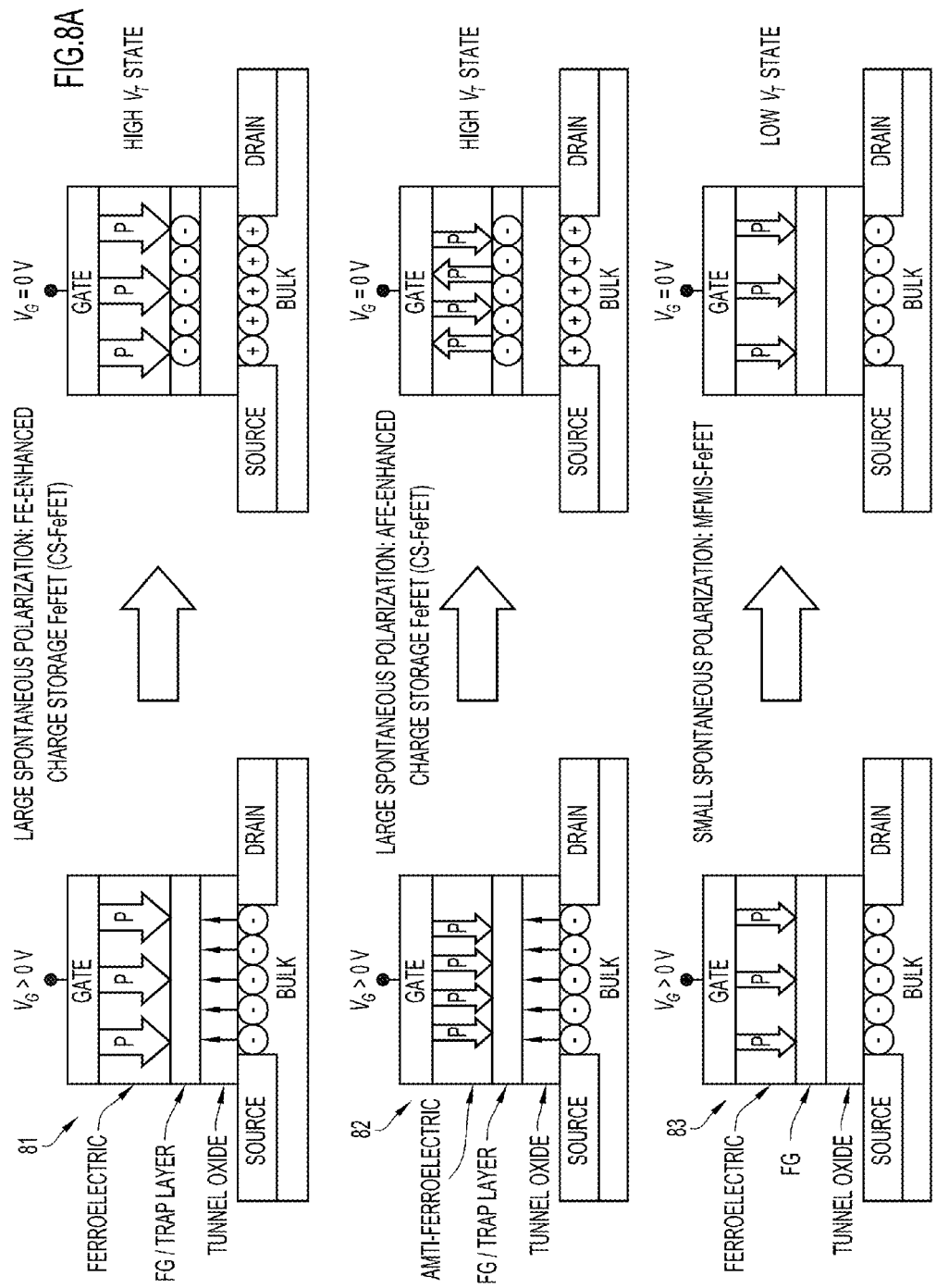
FIG. 8A illustrates differences between a CS-FeFET with a ferroelectric (FE) layer, a CS-FeFET with an anti-ferroelectric (AFE) layer and MFMIS devices for large and small remanent polarization according to an example implementation of the inventive concepts described herein.
Figure 8B:
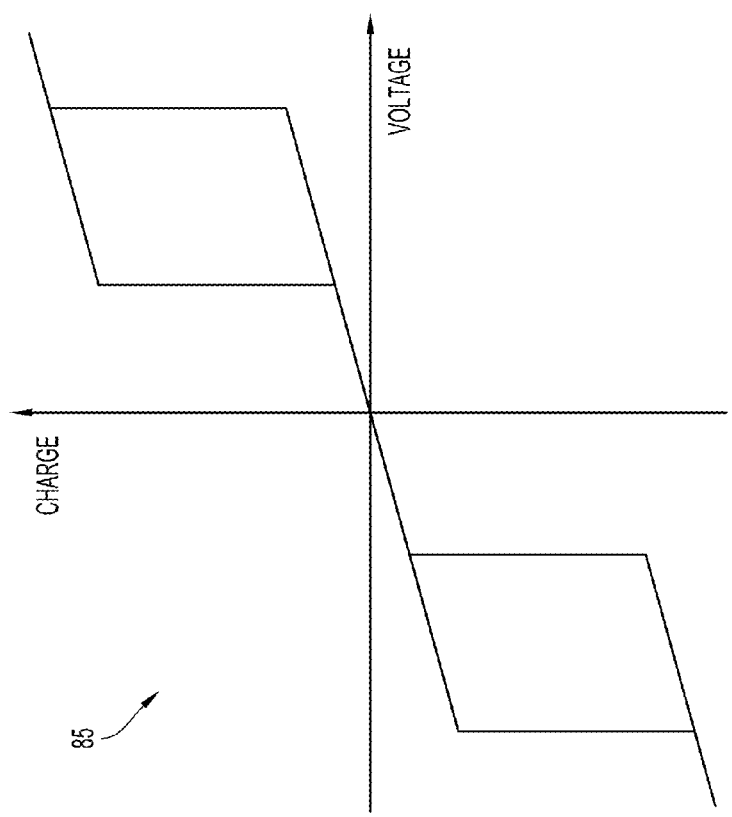
FIG. 8B is a diagram that illustrates charge against voltage for an antiferroelectric charge-voltage characteristic according to an example implementation of the inventive concepts described herein.

Referring now to FIGS. 8A and 8B, a new device concept is introduced which can make use of the above-described UEFES, namely the Charge Storage Ferroelectric Field Effect Transistor (CS-FeFET) briefly described above and is indicated generally at reference numeral 81. The CS-FeFET 81 makes use of the electric field enhancement across the interfacial oxide, which already takes place for moderate spontaneous polarizations of a ferroelectric material. If a gate stack free of fixed charges is assumed, then the electric displacement field may be described by Equation 1 below:

$$D = \in_0 E + P \quad \text{(Eq. 1)}$$

where D is the electric displacement field, $\in_0$ is the permittivity of free space, E is the electric field strength, and P is the polarization. Maxwell's equations state that under the absence of space charges in the gate stack, the displacement field, D, has to be constant across the gate stack. Hence, $D=\in_0\in_{FE}E_{FE}+P=\in_0\in_{OX}\in_{OX}$, whereas $\in_{FE}$ and $\in_{OX}$ represent the relative dielectric permittivity of the ferroelectric material and the interfacial oxide respectively and $\in_{FE}$ and $\in_{OX}$ the electric fields across the ferroelectric material and the interface. From this equation, it is evident that the electric field of the interfacial oxide between ferroelectric materials and semiconductor (whereas the interfacial oxide can be a series connection of a floating gate (FG)/charge storage (trap) layer and an interface) is enhanced by the ferroelectric polarization P. For example, once CS-FeFET 81 is transitioned to the high VT state (high threshold voltage) as indicated by the left-to-right arrow, negative charge is trapped in the charge storage (FG/Trap) layer (e.g., SiN or SiON but not limited to these) as indicated in the right-hand figure. Hence, the CS-FeFET combines a high polarization ferroelectric layer with an FG/charge storage layer below (or above) the ferroelectric layer.

Due to the field enhancement caused by the ferroelectric, write voltages (program and erase voltages) can be reduced to the switching voltage of the ferroelectric. In this device, it may be advantageous to have a ferroelectric with low coercive field strength and a large spontaneous polarization in order to reduce the operational voltages, while keeping the field enhancement large. Furthermore, tunnel oxides can be scaled down aggressively due to the fact that charge carriers are kept inside the storage layer due to the screening of the ferroelectric polarization. In classical charge storage devices, tunnel oxides have to maintain a certain thickness such that electrons do not leak out of the charge storage layer over time. Incorporating a ferroelectric material into the gate stack, however, provides an additional internal field created by the polarization which attracts charges to the charge storage layer/ferroelectric interface. The polarization therefore represents an inherent internal voltage source hindering the electrons from leaking out.

Instead of using a ferroelectric material that shows a remanent polarization even at 0 V applied to the gate, the ferroelectric material might be replaced by an anti-ferroelectric (AFE) as shown in CS-FeFET 82 and also graph 85 shown in FIG. 8B. As an example, doped HfO2 or ZrO2 or a mixture of both can be used for an anti-ferroelectric film. Any suitable additives may be provided within the ferroelectric material oxide layer, without limitation, any one or more of C, Si, Al, Ge, Sn, Sr, Pb, Mg, Ca, Sr, Ba, Ti, Zr (e.g., providing Zr as an additive in a HfO$_2$ layer), Ti, and any one or more of the rare earth elements (e.g., Y, Gd, etc.). Therefore it is required that the amount of dopant species in the HfO$_2$ has to be higher than used for inducing the ferroelectric properties. That is, depending on the dopant species, in the range of 5-15 mol % (ferroelectric properties are generally created with 0-5%). Moreover, ZrO$_2$ can show antiferroelectric properties even with no doping and when mixing with HfO$_2$ AFE properties lie in the range of a 1:1 to 0:1 solid solution (HfO$_2$:ZrO$_2$).

The anti-ferroelectric properties provide the advantage that the field enhancing effect of the spontaneous polarization can still be used to reduce the operational voltages of standard CS-devices. As compared to the CS-FeFET incorporating a ferroelectric material with remanence, the anti-ferroelectric CS-FeFET does not have a ferroelectric threshold voltage shift superimposed on the charge storage based threshold voltage shift. This is very advantageous because the VT shift caused by ferroelectric remanent polarization and the one caused by charge storage are counteracting each other. The AFE CS-FeFET on the other hand looses the advantage of better retention because at 0V gate potential, there is no net polarization anymore which also yields a zero internal field. The term "no remanence" means the spontaneous polarization only of the material. In most cases the spontaneous polarization is below 1 μC/cm2 when no electrical field is applied across the antiferroelectric material.

Moreover, if the architecture (now limited solely to a floating gate as charge storage medium) is combined with a low polarization ferroelectric material, a prior art MFMIS-like FeFET 83 is created. As an example, the material system employed uses a HfO$_2$ ferroelectric material in which the spontaneous polarization can be tailored by several measures in order to realize different types of devices. First of all, different dopant species have been found to produce different magnitudes of both remanent polarization and coercive field. Moreover, different ferroelectric layer thicknesses affect these properties. Thermal treatments before top electrode deposition (post deposition anneal and not post metallization anneal) can reduce the ferroelectric polarization. If the above described ferroelectric material parameters cannot be reached with a single layer, then by using multi-layer stacks, the desired properties can be reached. The reduced polarization value of the ferroelectric material provides a decreased interfacial field stress which reduces charge injection (opposite to the aim of the CS-FeFET) which is advantageous for the lifetime of a FeFET.

Figure 9:
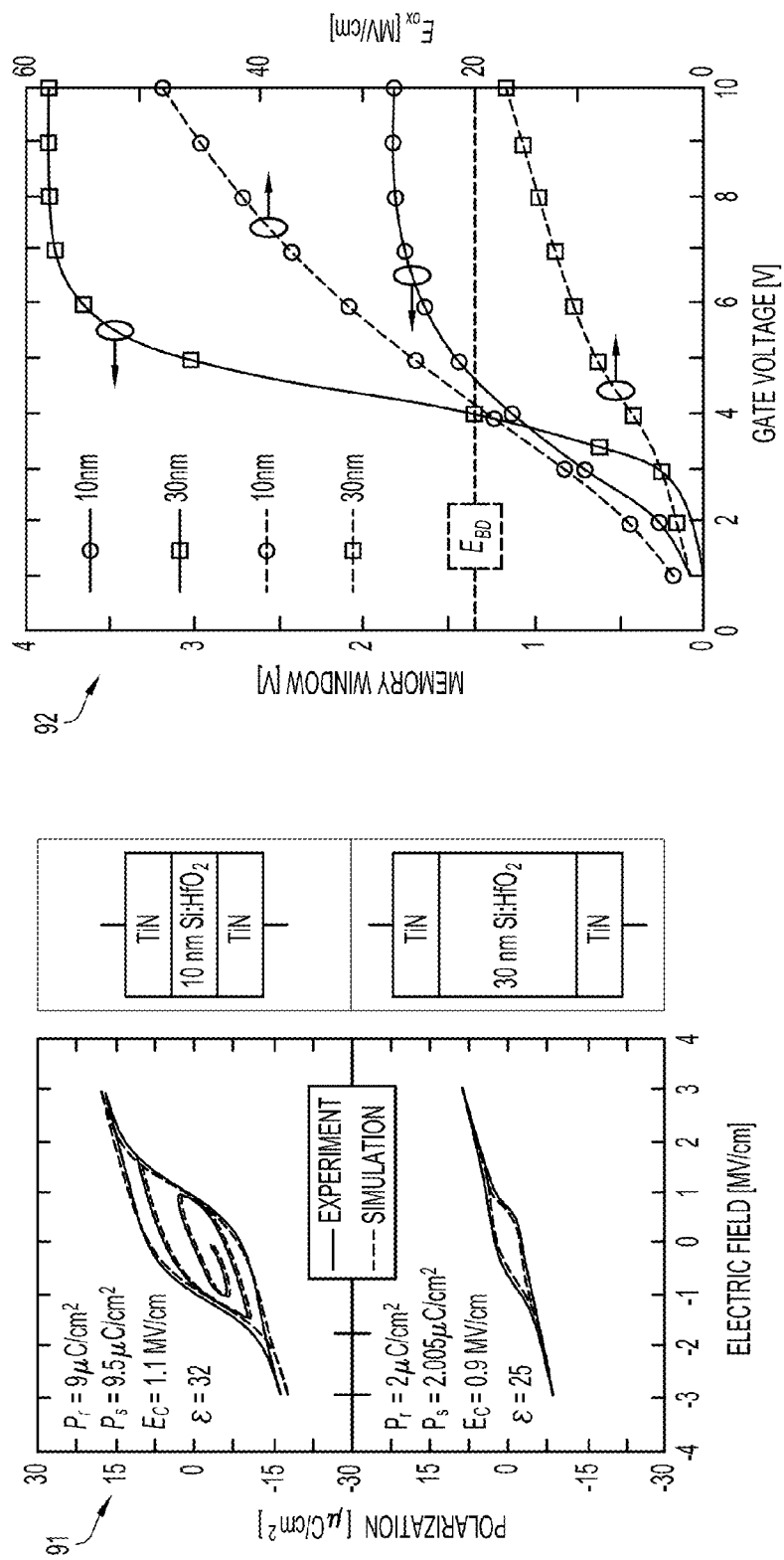
FIG. 9 illustrates example simulation data when tailoring remanent polarization to lower values based on ferroelectric film thickness and processing conditions according to an example implementation of the inventive concepts described herein.

Turning now to FIG. 9, simulation results show that when the spontaneous and remanent polarization are reduced due to an increased ferroelectric layer thickness (as seen in experiments), it is possible to reduce the interfacial field stress as mentioned before. The simulation example (indicated by reference numeral 91) shows how the interfacial field is decreased or increased depending on the polarization value of the ferroelectric material. In addition, the memory window of the device grows as predicted from analytical derivation, e.g., as indicated by reference numeral 92. Accordingly, the device properties can be tailored by material engineering using the appropriate processing conditions (doping, layer thickness/combination, thermal treatment, etc.). Note that each curve in graph 92 has an arrow to indicate whether the curve should be read with respect to the left or right vertical axis.

Figure 10:
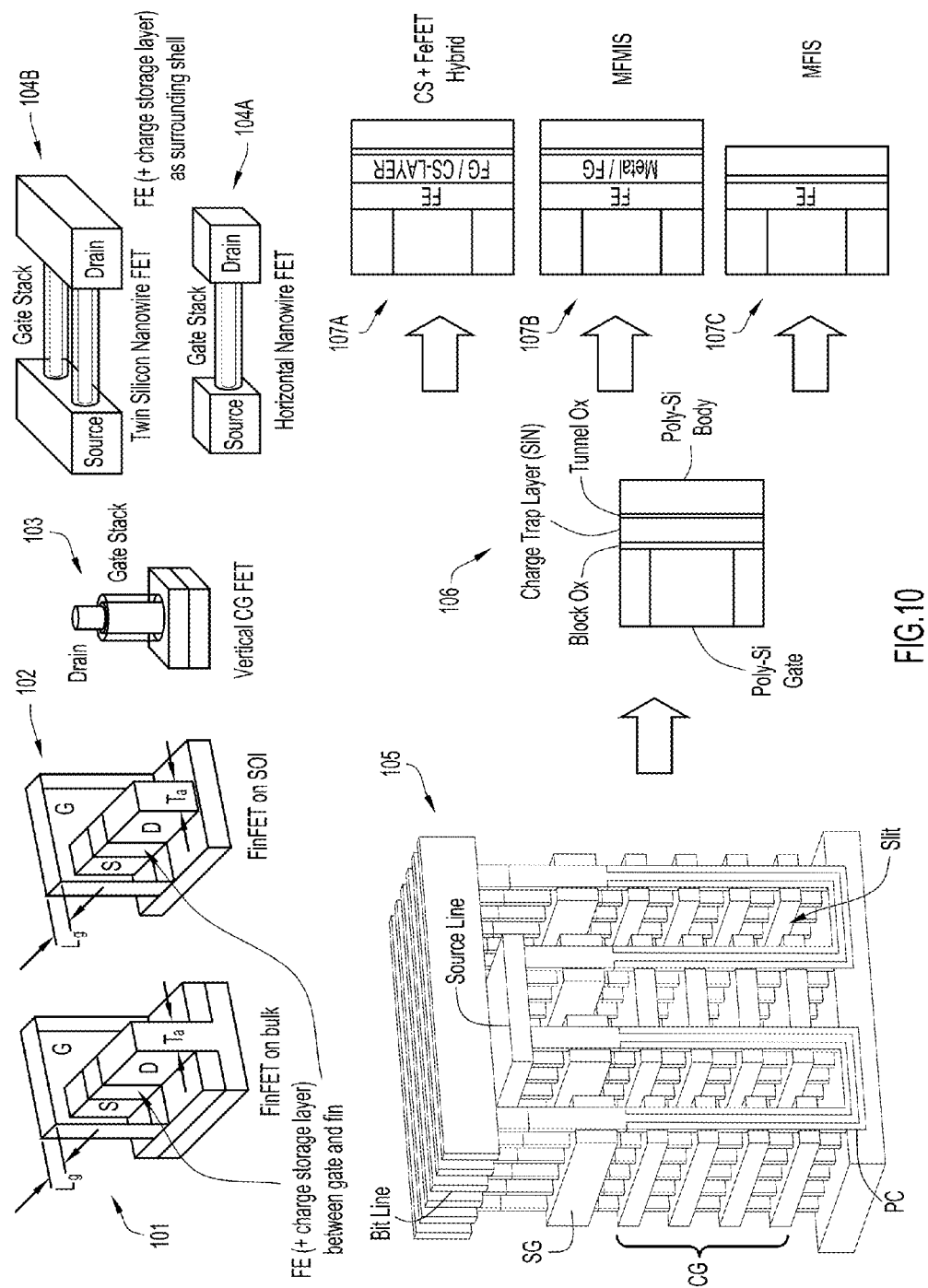
FIG. 10 illustrates examples of potential FeFET architectures that may employ the inventive concepts described herein.

FIG. 10 shows that the inventive concepts described herein are not limited to planar transistors, but can be extended to three dimensional (3D) architectures by persons skilled in the art. Multiple-gate transistor architectures like FinFETs (i.e., FET with a fin-like structure) can incorporate the proposed layer stacks to create 3D FeFETs, MFIS, MFMIS or CS-FeFET devices. Furthermore, vertical NAND Flash device architectures can be modified to incorporate the layers as well benefiting from the advantages described herein.

For example, FE and CS layers can be inserted into FinFETs on bulk 101, FinFETs on silicon on insulator (SOI) 102, vertical control gate (CG) FETs 103, nanowire FETs (with FE or FE+CS shells) 104A and 104B, or multi-cell devices 105. Several implementations for applying the techniques described herein to FE or FE+CS base configuration 106 to achieve the example variations show at 107A, 107B and 107C, e.g., as indicated by the left-to-right arrows. In these examples with respect base 106, a SiN charge trap layer is shown, e.g., silicon nitride (SiN) and may include other layers such as silicon oxide (SiO$_2$) or aluminum oxide (Al$_2$O$_3$).

Having described example embodiments of a new and improved technique for a uniform electric field erase scheme (UEFES) and a charge storage ferroelectric memory hybrid device, it is believed that other modifications, variations and changes will be suggested to those skilled in the art in view of the teachings set forth herein. This includes that transferring the UEFES from n-channel to p-channel FeFETs by changing the doping scheme and polarity of the applied voltages falls under this suggestion of those skilled people in the art. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method of erasing a ferroelectric field effect transistor (FeFET) memory circuit comprising a plurality of FeFET memory cells, each FeFET comprising a gate stack, a source, a drain, a channel and a bulk substrate region, wherein the gate stack comprises a gate and a ferroelectric layer disposed between the gate and the channel, the method comprising:
applying first and second voltages to the source and drain regions, respectively, of at least one FeFET memory cell of the plurality of FeFET memory cells, wherein the first and second voltages are configured to generate a substantially uniform electric field between the channel and gate in order to generate a substantially uniform change in a polarization of the ferroelectric layer of the at least one FeFET memory cell; and
applying third and fourth voltages to the gate and bulk substrate regions, respectively, of the at least one FeFET memory cell during said applying of the first and second voltages to the source and drain regions of the at least one FeFET memory cell to cause erasure of the at least one FeFET memory cell, wherein the third voltage is one of a ground state or a voltage of opposite voltage polarity to the first and second voltages, and wherein the fourth voltage is one of a ground state or a voltage of a same voltage polarity to the first and second voltages and lower in absolute value than the first and second voltages.

2. The method of claim 1, wherein the first, second, third and fourth voltages are applied to operate the at least one FeFET memory cell substantially close to or in the region of punch through in order to generate a substantially uniform change in a polarization of the ferroelectric layer of the at least one FeFET memory cell.

3. The method of claim 1, wherein the channel comprises an n-channel or a p-doped region and the first and second voltages are positive.

4. The method of claim 1, wherein the channel comprises a p-channel or an n-doped region and the first and second voltages are negative.

5. The method of claim 1, further comprising selecting one or more FeFET memory cells for erasure on an individual memory cell, a word of memory cells or a block of memory cells basis using a combination of the first, second, third and fourth voltages.

6. The method of claim 5, wherein selecting comprises selecting the one or more FeFET memory cells for erasure using a combination of gate selection, source selection, and drain selection, while respectively applying the third and fourth voltages to the gate and bulk substrate region of FeFET memory cells selected for erasure, wherein corresponding sources and drains of FeFET memory cells selected for erasure are held at corresponding first and second voltages.

7. The method of claim 1, wherein the at least one FeFET memory cell comprises a short channel.

8. The method of claim 1, wherein the at least one FeFET memory cell comprises a channel including one or more of an extension implant and a halo implant.

9. The method of claim 1, wherein the at least one FeFET memory cell comprises a long channel and the long channel includes a corresponding concentration of well implants.

10. The method of claim 1, wherein the gate stack of the at least one FeFET memory cell comprises a charge storage layer adjacent to the ferroelectric layer in the gate stack.

11. The method of claim 1, wherein the gate stack of the at least one FeFET memory cell lacks an intermediate conductive layer in the gate stack between the ferroelectric layer and the channel with sufficient conductivity to generate a substantially uniform electric field across the ferroelectric layer.

12. The method of claim 1, wherein the fourth voltage applied to the bulk substrate region is the ground state.

13. A method of erasing a ferroelectric field effect transistor (FeFET) memory circuit comprising a plurality of FeFET memory cells, each FeFET comprising a gate stack, a source, a drain, a channel and a bulk substrate region, wherein the gate stack comprises a gate and a ferroelectric layer disposed between the gate and the channel, the method comprising:

selecting at least one of the plurality of FeFET memory cells for erasure on an individual memory cell, a word of memory cells or a block of memory cells basis;

applying first and second voltages to the source and drain regions, respectively, of the at least one FeFET memory cell; and applying third and fourth voltages to the gate and bulk substrate regions, respectively, of the at least one FeFET memory cell during said applying of the first and second voltages to the source and drain regions of the at least one FeFET memory cell to cause erasure of the at least one FeFET memory cell, wherein the third voltage is one of a ground state or a voltage of opposite voltage polarity to the first and second voltages, and wherein the fourth voltage is one of a ground state or a voltage of a same voltage polarity to the first and second voltages and lower in absolute value than the first and second voltages; and inhibiting erasure of those FeFET memory cells not selected for erasure and adjacent to those FeFET memory cells selected for erasure by applying one or more inhibit voltages to respective gates, sources and drains of the adjacent FeFET memory cells.

14. The method of claim 13, further comprising adjusting a threshold voltage ($V_T$) by varying the remanence of the ferroelectric layer.

15. The method of claim 13, further comprising adjusting a threshold voltage ($V_T$) by varying a charge stored in the charge trap or floating gate layer, and the remanence of the ferroelectric layer or the non remanence of an antiferroelectric layer.

16. The method of claim 13, further comprising adjusting a threshold voltage ($V_T$) by varying the distribution of majority carriers of a floating gate layer, and the remanence of the ferroelectric layer.

* * * * *